(12) United States Patent
Okada

(10) Patent No.: US 6,913,962 B2
(45) Date of Patent: Jul. 5, 2005

(54) MANUFACTURING METHOD OF SEMICONDUCTOR DEVICE AND SEMICONDUCTOR DEVICE

(75) Inventor: Yasuo Okada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/619,934

(22) Filed: Jul. 15, 2003

(65) Prior Publication Data

US 2004/0058534 A1 Mar. 25, 2004

(30) Foreign Application Priority Data

Jul. 19, 2002 (JP) ........................................ 2002-210666

(51) Int. Cl.[7] .......................................... H01L 21/8238
(52) U.S. Cl. ...................... 438/221; 438/227; 438/296; 438/424; 438/696; 438/724
(58) Field of Search ................................ 438/199, 218, 438/221, 227, 296, 424, 694, 696, 724, 299, 303, 294, 297, 586, 595; 257/288, 350, 368, 374, 501, 506

(56) References Cited

U.S. PATENT DOCUMENTS 6,319,784 B1 * 11/2001 Yu et al. ..................... 438/301
6,411,548 B1 * 6/2002 Sakui et al. ............ 365/185.17
6,506,647 B2 * 1/2003 Kuroda et al. .............. 438/275
6,613,636 B2 * 9/2003 Wada et al. ................. 438/301
2001/0005626 A1 * 6/2001 Kim et al. ................... 438/637

FOREIGN PATENT DOCUMENTS

| JP | 06-168955 | 6/1994 | ......... H01L/21/336 |
| JP | 08-250716 | 9/1996 | |
| JP | 11-340456 | 10/1999 | .......... H01L/29/78 |
| JP | 2002-110997 | 4/2002 | |
| JP | 2002-231938 | 8/2002 | |
| JP | 2003-037115 | 2/2003 | ......... H01L/21/336 |

* cited by examiner

Primary Examiner—Hsien-Ming Lee
(74) Attorney, Agent, or Firm—Hogan & Hartson, LLP

(57) ABSTRACT

A manufacturing method of a semiconductor device disclosed herein, comprises: forming a buried insulating film in a semiconductor substrate; forming semiconductor elements isolated by the buried insulating film; cleaning a surface side of the semiconductor substrate with a cleaning solution; and covering a surface side of the buried insulating film with a protective film before the step of cleaning the surface side of the semiconductor substrate, wherein a protective film is resistant to the cleaning solution.

7 Claims, 14 Drawing Sheets

US 6,913,962 B2
MANUFACTURING METHOD OF SEMICONDUCTOR DEVICE AND SEMICONDUCTOR DEVICE

CROSS REFERENCE TO RELATED APPLICATION

This application claims benefit of priority under 35 U.S.C.§119 to Japanese Patent Application No. 2002-210666, filed on Jul. 19, 2002, the entire contents of which are incorporated by reference herein.

BACKGROUND OF THE INVENTION

1. Field of the Invention

The present invention relates to a manufacturing method of a semiconductor device and the semiconductor device, and particularly relates to a manufacturing method of a semiconductor device in which semiconductor elements having favorable characteristics are formed and the semiconductor device.

2. Description of the Related Art

In recent semiconductor devices, in order to achieve a reduction in the resistance of polysilicon wiring and a diffusion layer, a salicide metal layer is formed on the surface sides thereof. In forming the salicide metal layer, the formation of the uniform salicide metal layer on the polysilicon wiring and a wiring layer is demanded. A manufacturing process to form such a salicide metal layer is disclosed, for example, in Japanese Patent Laid-open No. 8-250716.

The manufacturing process of a related semiconductor device, which is disclosed in Japanese Patent Laid-open No. 8-250716 and so on, will be explained based on FIG. 1 to FIG. 3. FIG. 1 is a diagram showing a section of the related semiconductor device before the salicide metal layer is formed, and FIG. 2 is a diagram showing a section of the related semiconductor device after the salicide metal layer is formed. FIG. 3 is a plan view of FIG. 2.

As shown in FIG. 1, to form the uniform the salicide metal layer, cleaning with dilute HF is performed before the salicide metal layer is formed. Namely, oxide films and particles, which are naturally formed on the surfaces of P$^+$ diffusion regions 10 and 10, the surfaces of N$^+$ diffusion regions 12 and 12, and the surfaces of the gate electrodes 14 made of a polysilicon layer, are removed.

Thereafter, as shown in FIG. 2, the salicide metal layer is formed on the surfaces of the P$^+$ diffusion regions 10 and 10, the surfaces of the N$^+$ diffusion regions 12 and 12, and the surfaces of the gate electrodes 14 made of the polysilicon layer.

However, in the related manufacturing method, there is a problem that during cleaning treatment with dilute HF, a silicon oxide film (SiO$_2$) which forms a buried insulating film 20 for element isolation dissolves due to the dilute HF. In other words, there is a problem that SiO$_2$ and HF react with each other as shown in the following formula to thereby precipitate water mark.

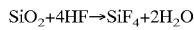

$$SiO_2 + 4HF \rightarrow SiF_4 + 2H_2O$$

Particularly as shown in FIG. 3, when this precipitated water mark 30 adheres to the surfaces of P$^+$ diffusion regions 10 and 10, the surfaces of N$^+$ diffusion regions 12 and 12, and the surfaces of the gate electrodes 14 made of the polysilicon layer, the water mark 30 functions like a mask material. Hence, as shown in FIG. 2, the salicide metal layer is not formed in portions corresponding to the water mark 30, and as a result, the uniform saliside metal layer cannot be obtained. If the uniform salicide metal layer is not formed, the resistance of the P$^+$ diffusion regions 10 and 10, the N$^+$ diffusion regions 12 and 12, and the gate electrodes 14 made of the polysilicon layer increases, which deteriorates characteristics of MISFETs as semiconductor elements.

Moreover, in the semiconductor device shown in FIG. 2, the height of the buried insulating film 20 and the height of the gate electrode 14 are different, thereby a step occurs between the buried insulating film 20 and the gate electrode 14. Therefore, there is a problem that when an interlayer dielectric is formed thereon, the planarity of the interlayer dielectric is deteriorated.

SUMMARY OF THE INVENTION

In order to accomplish the aforementioned and other objects, according to one aspect of the present invention, a manufacturing method of a semiconductor device, comprises:

forming a buried insulating film in a semiconductor substrate;

forming semiconductor elements isolated by the buried insulating film;

cleaning a surface side of the semiconductor substrate with a cleaning solution; and covering a surface side of the buried insulating film with a protective film before the step of cleaning the surface side of the semiconductor substrate, wherein a protective film is resistant to the cleaning solution.

According to another aspect of the present invention, a semiconductor device, comprises:

a buried insulating film which is formed in a semiconductor substrate;

semiconductor elements which are formed on the semiconductor substrate and which are isolated by the buried insulting film; and a protective film which covers all of a surface side of the buried insulating film but which does not cover at least a region in which a salicide metal layer of the semiconductor element is formed, wherein the protective film is resistant to a hydrofluoric acid based solution.

According to another aspect of the present invention, a semiconductor device, comprises:

a buried insulating film which is formed in a semiconductor substrate;

MISFETs which are formed on the semiconductor substrate and which are isolated by the buried insulating film;

a protective film which covers all of a surface side of the buried insulating film and which is resistant to a hydrofluoric acid based solution; and a salicide metal layer which is formed on source/drain diffusion regions of the MISFET and which is formed in a self-alignment manner relative to the protective film.

DETAILED DESCRIPTION OF THE EMBODIMENTS

First Embodiment

In the first embodiment, by covering at least the surface of a buried insulating film with a protective film resistant to dilute HF before cleaning a semiconductor device with dilute HF, dissolution of the buried insulating film at the time of cleaning with dilute HF is avoided. Further details will be given below.

Figure 1:
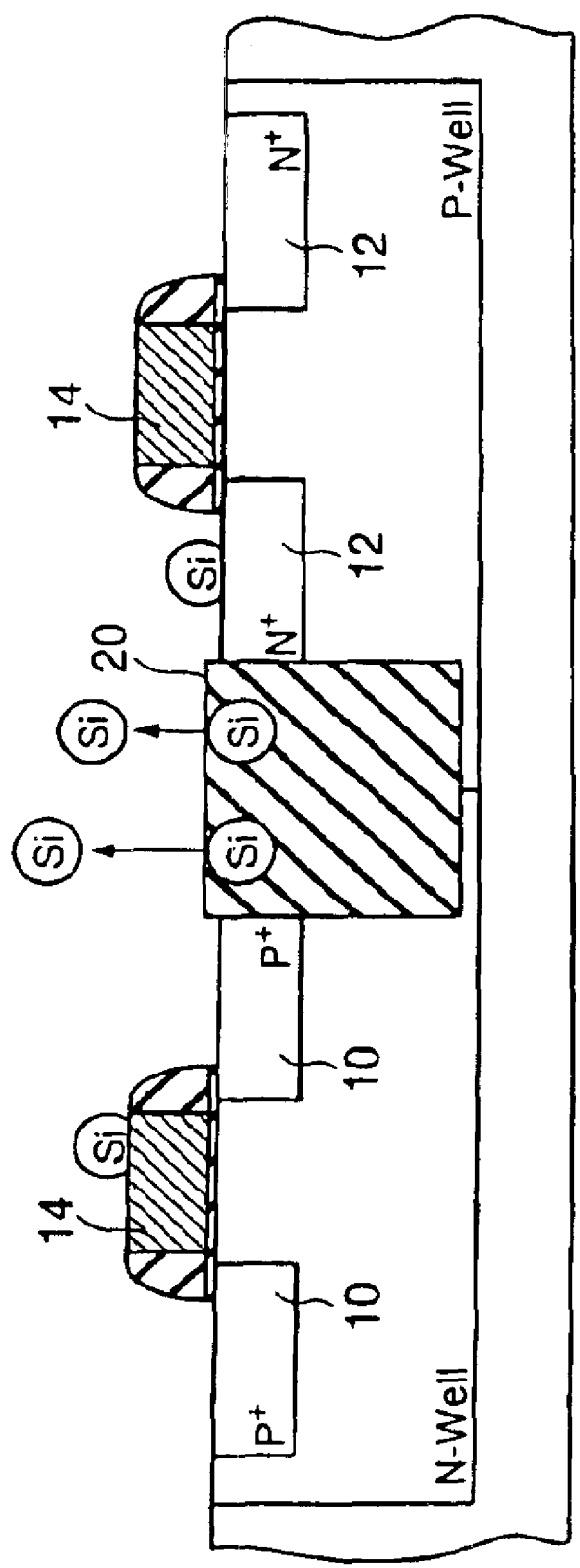
FIG. 1 is a sectional view explaining a manufacturing process of a related semiconductor device (cleaning treatment)
Figure 2:
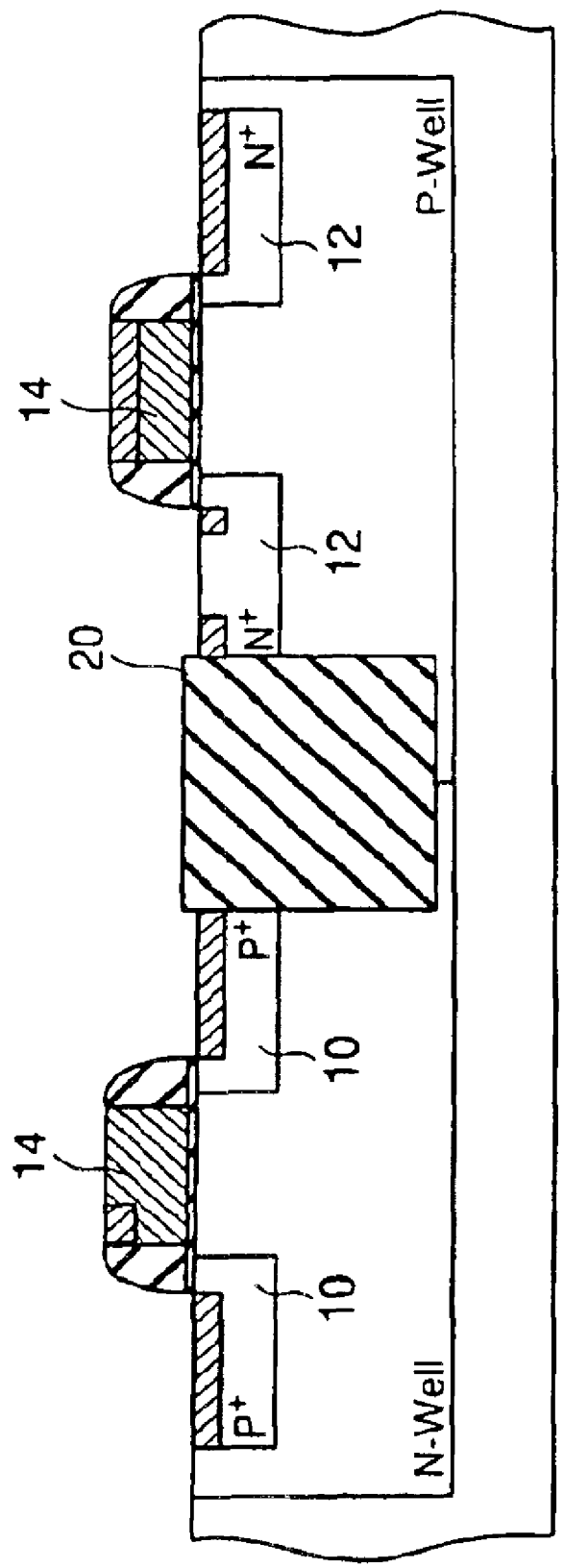
FIG. 2 is a sectional view explaining the manufacturing process of the related semiconductor device (salicide metal layer forming processing)
Figure 3:
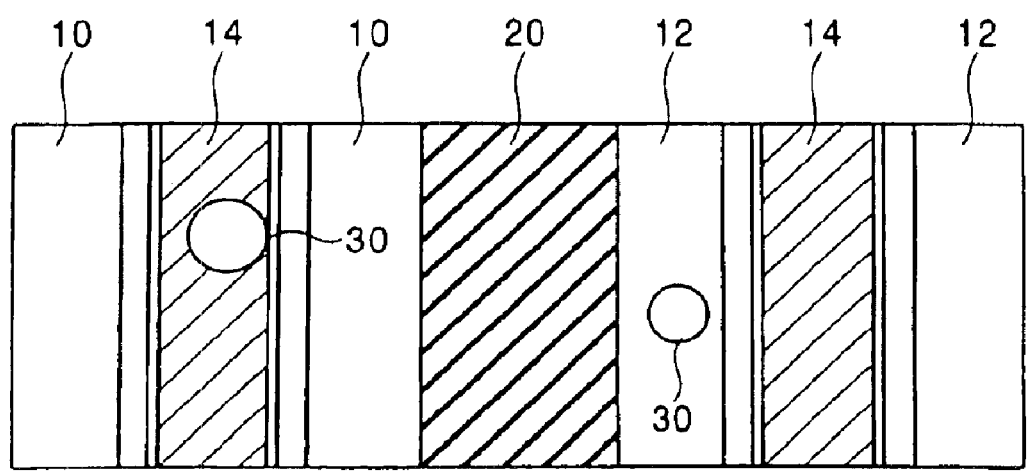
FIG. 3 is a plan view of the semiconductor device in FIG. 2.
Figure 4:
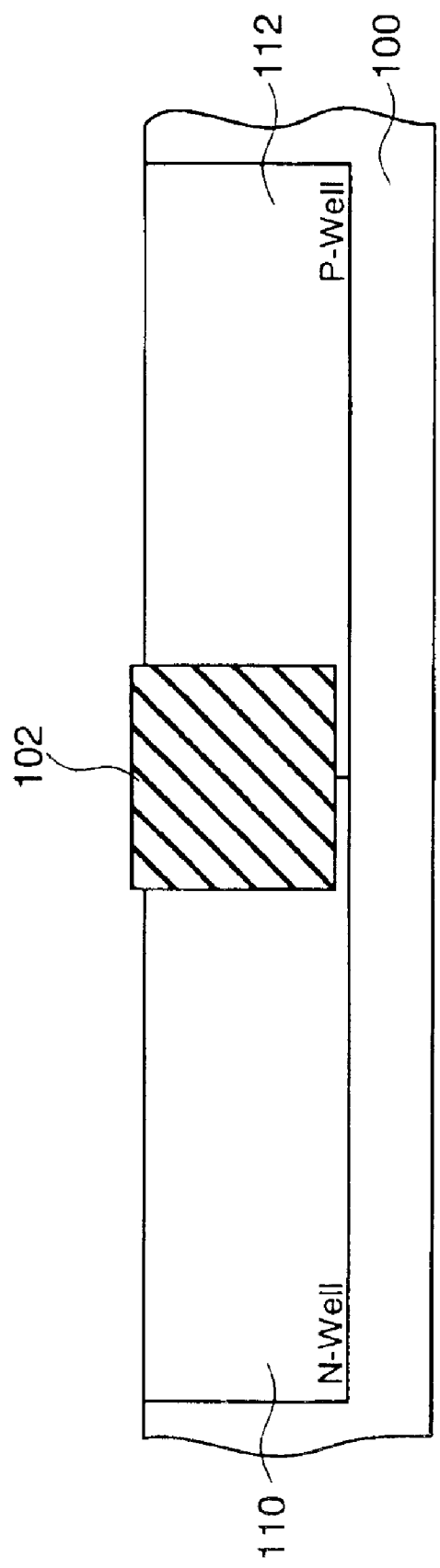
FIG. 4 is a sectional view explaining part of a manufacturing process of a semiconductor device according to a first embodiment.

First, as shown in FIG. 4, a buried insulating film 102 is formed in a semiconductor substrate 100, for example, made of silicon. In this embodiment, the buried insulating film 102 is formed by a silicon oxide film ($SiO_2$). Additionally, in this embodiment, the buried insulating film 102 is formed by an STI manufacturing process. Subsequently, an N-type well 110 is formed by implanting impurity ions such as arsenic into the surface side of the semiconductor substrate 100, and a P-type well 112 is formed by implanting impurity ions such as boron into the surface side of the semiconductor substrate 100.

Figure 5:
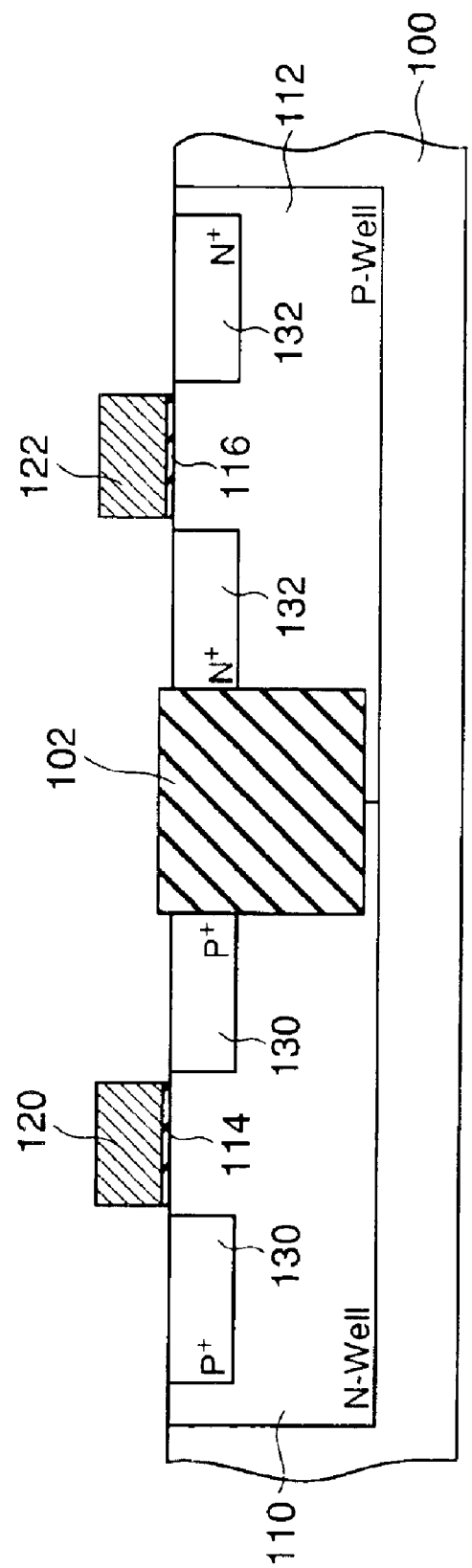
FIG. 5 is a sectional view explaining part of the manufacturing process of the semiconductor device according to the first embodiment.

Thereafter, as shown in FIG. 5, an insulating film such as a silicon oxide film and a polysilicon layer are formed on the surface of the semiconductor substrate 100, and these insulating film and polysilicon layer are etched in a predetermined pattern by RIE (Reactive Ion Etching), so that gate insulating films 114 and 116 and gate electrodes 120 and 122 are formed. Then, by covering a region corresponding to the P-type well 112 and a predetermined region of the N-type well 110 with a resist or the like and implanting the impurity ions such as boron, $P^+$ diffusion regions 130 and 130 are formed. One of these $p^+$ diffusion regions 130 and 130 becomes a source diffusion region and the other thereof becomes a drain diffusion region. Subsequently, contrary to the above, by covering a region corresponding to the N-type well 110 and a predetermined region of the P-type well 112 with the resist or the like and implanting the impurity ions such as arsenic, $N^+$ diffusion regions 132 and 132 are formed. One of these $N^+$ diffusion regions 132 and 132 becomes a source diffusion region and the other thereof becomes a drain diffusion region. Hence, a P-type MISFET and an N-type MISFET each with an LDD structure (Lightly Doped Drain Structure) are formed.

Figure 6:
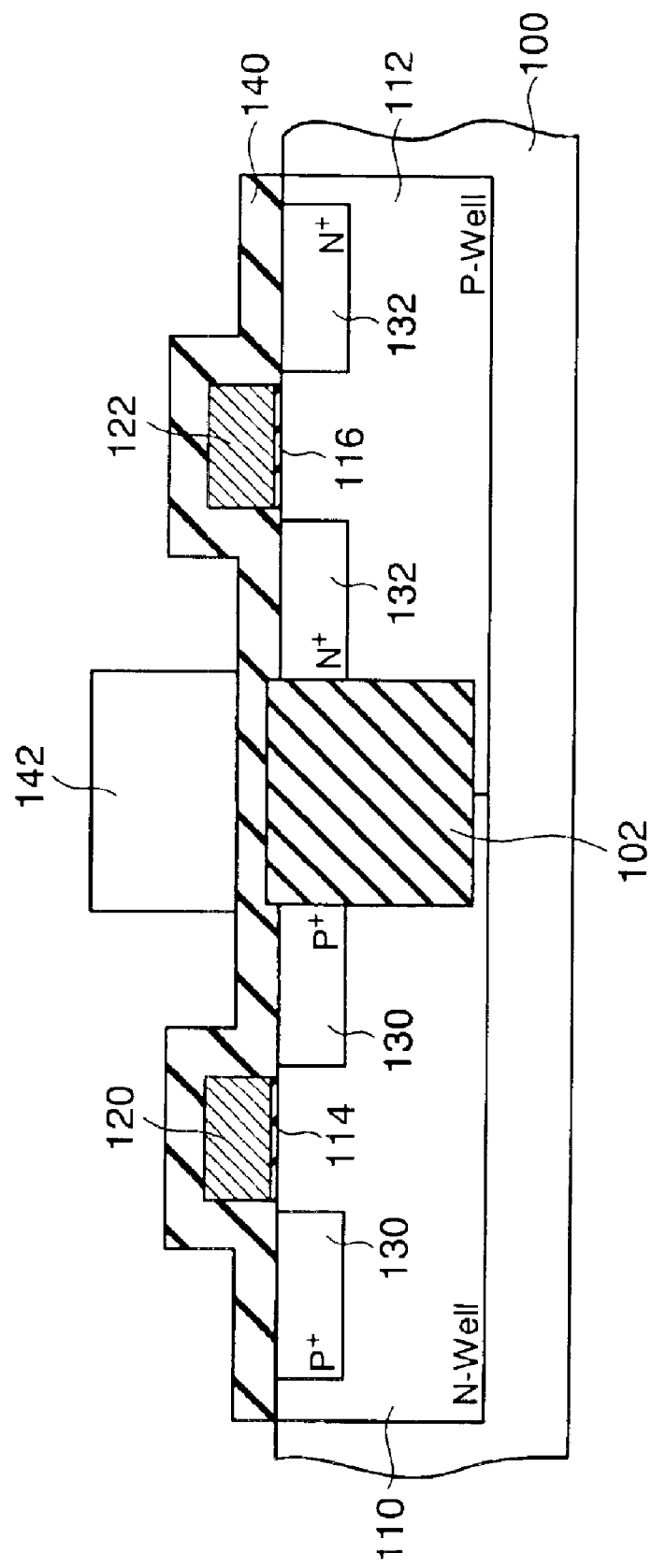
FIG. 6 is a sectional view explaining part of the manufacturing process of the semiconductor device according to the first embodiment.

Next, as shown in FIG. 6, an insulating film 140 is formed on the surface of the semiconductor substrate 100. In this embodiment, the insulating film 140 is formed of a silicon nitride film (SiN). Then, a resist 142 is formed and patterned on the insulating film 140 so as to cover an upper portion of the buried insulating film 102.

Figure 7:
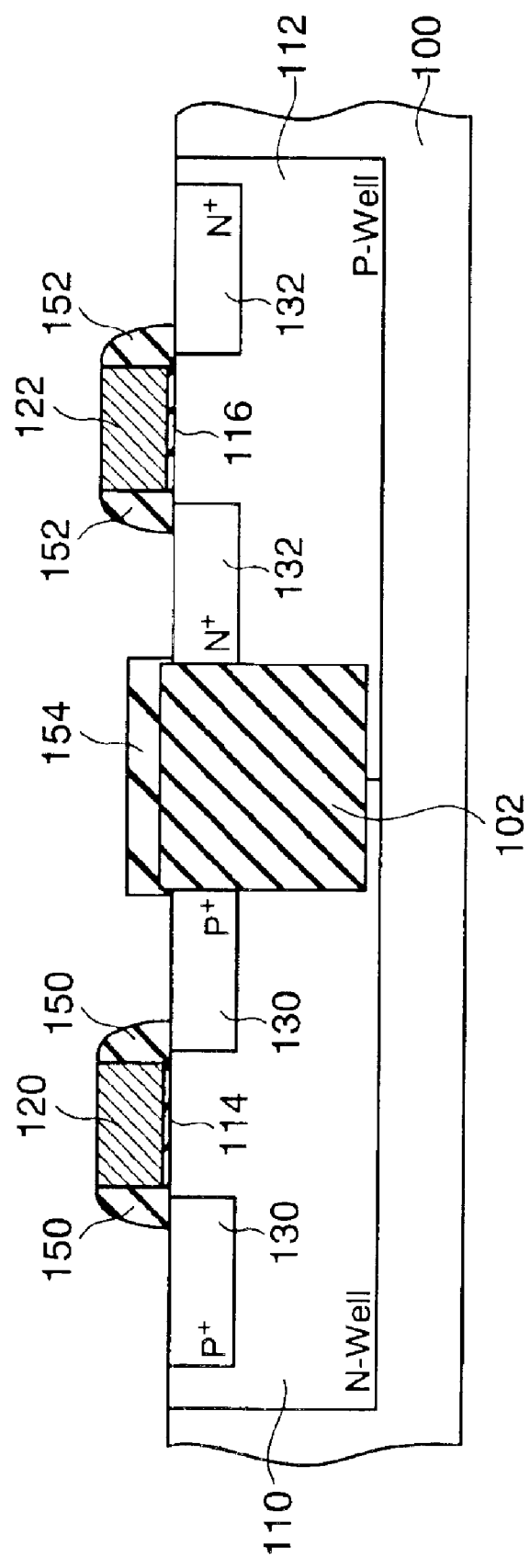
FIG. 7 is a sectional view explaining part of the manufacturing process of the semiconductor device according to the first embodiment.

Thereafter, as shown in FIG. 7, by etching the insulating film 140 by RIE, sidewalls 150 and 152 are formed on the side of the gate electrodes 120 and 122, and a protective film 154 which covers all the surface side of the buried insulating film 102 is formed on the buried insulating film 102. Namely, by etching back the insulating film 140, the sidewalls 150 and 142 are formed in a self-alignment manner. Moreover, the protective film 154 is formed by leaving a portion of the insulating film 140, which is covered with the resist 142, by etching. This protective film 154 is formed so as to cover all the surface side of the buried insulating film 102 and so as not to cover at least a region in which an undermentioned salicide metal layer is formed. Subsequently, a natural oxide film and particles on the surface of the semiconductor substrate 100 are removed by cleaning with dilute HF. Since the buried insulating film 102 is covered with the protective film 154 at the time of this cleaning with dilute HF, the dissolution of $SiO_2$ can be prevented, which can prevent the generation of water mark.

Figure 8:
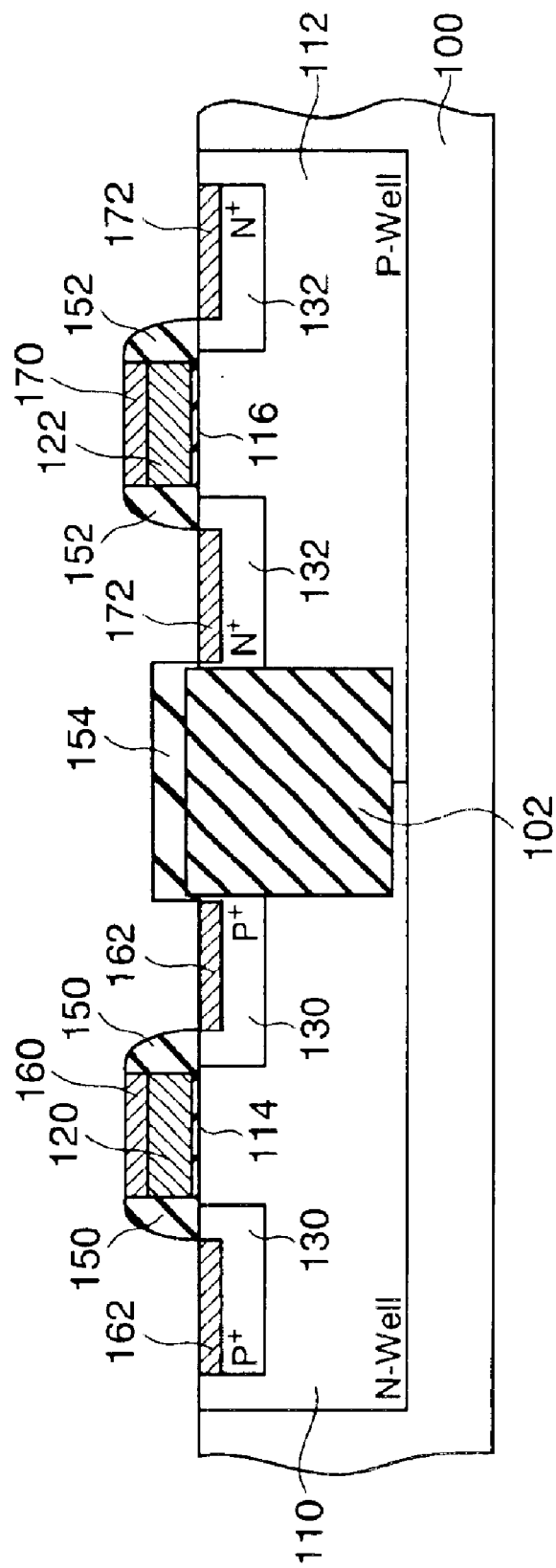
FIG. 8 is a sectional view explaining part of the manufacturing process of the semiconductor device according to the first embodiment.

Thereafter, as shown in FIG. 8, salicide metal layers 160, 162, 170, and 172 are formed on the surface sides of the polysilicon layers of the gate electrodes 120 and 122 and the surface sides of the diffusion regions 130 and 132. In this embodiment, the salicide metal layers 160, 162, 170, and 172 are formed as follows. Namely, a high melting point metal film is formed on the surface side of the semiconductor substrate 100. This high melting point metal film is made of, for example, Ti, Mo, W, Ni, or the like. Since, as described above, the water mark is not generated when this high melting point metal film is formed, it is possible to form the uniform high melting point metal film. Then, by subjecting it to thermal processing, the salicide metal layers 160 and 170 are formed on the surface sides of the gate electrodes 120 and 122 in a self-alignment manner, and the salicide metal layers 162 and 172 are formed on the surface sides of the diffusion regions 130 and 132 in a self-alignment manner relative to the protective film 154.

Figure 9:
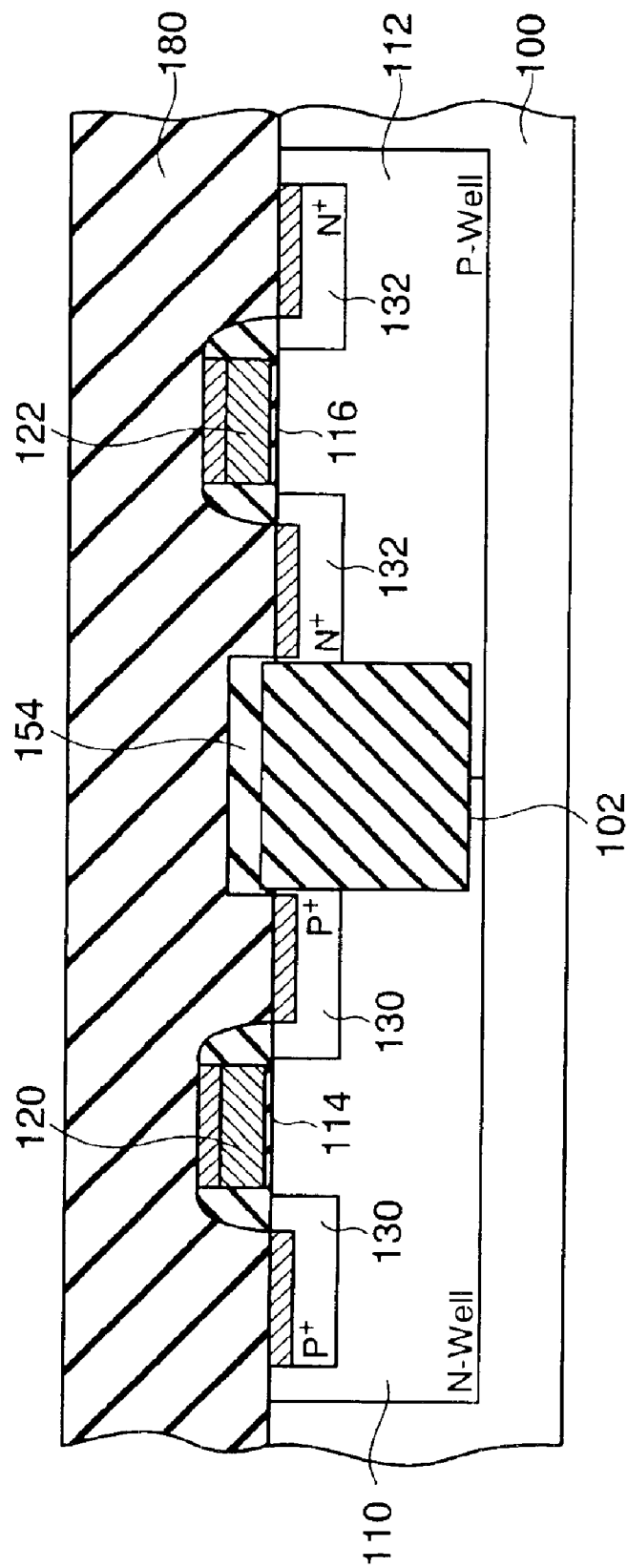
FIG. 9 is a sectional view explaining part of the manufacturing process of the semiconductor device according to the first embodiment.

Subsequently, as shown in FIG. 9, a silicon oxide film is formed on all the surface of the semiconductor substrate 100. Since the protective film 154 is formed on this occasion, a step between the gate electrodes 120 and 122 and the buried insulating film 102 is reduced, leading an improvement in the planarity of the silicon oxide film. Then, by planarizing the silicon oxide film by CMP (Chemical Mechanical Polishing), an interlayer dielectric 180 is formed.

As described above, according to the semiconductor device of this embodiment, the buried insulating film 102 is covered with the protective film 154 before cleaning with dilute HF, whereby the precipitation of water mark from the buried insulating film 102 during cleaning treatment can be avoided. Hence, the uniform salicide metal layers 160, 162, 170, and 172 can be formed, and the characteristics of MISFETs can be maintained favorably.

Moreover, by covering the buried insulating film 102 with the protective film 154, the step between the buried insulating film 102 and the gate electrodes 120 and 122 can be reduced, resulting in improved planarity when the interlayer dielectric is formed thereon.

Furthermore, a material of the protective film 154 is the insulating film 140 and therefore the material of the protective film 154 is the same as that of the sidewalls 150 and 152, whereby the protective film 154 can be obtained without adding a new film forming process.

Second Embodiment

In the second embodiment, the parasitic capacitance of the MISFET is increased by greatly extending the protective film 154 in the aforementioned first embodiment to the sides of the diffusion regions 130 and 132. Further details will be given below.

Figure 10:
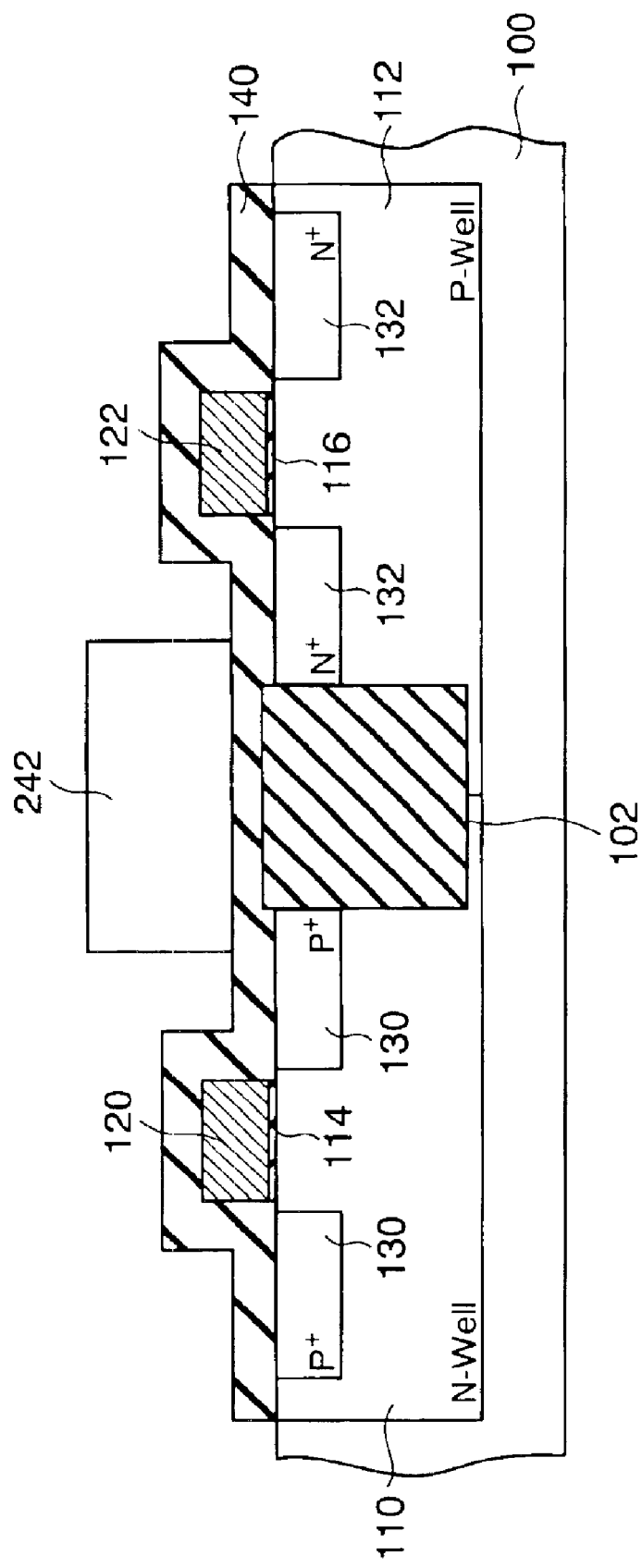
FIG. 10 is a sectional view explaining part of a manufacturing process of a semiconductor device according to a second embodiment.

A manufacturing method of a semiconductor device according to this embodiment is the same as that in the aforementioned first embodiment in FIG. 4 and FIG. 5. However, a change is made to the size of the resist 142 in the aforementioned first embodiment. Namely, as shown in FIG. 10, a resist 242 is formed on the insulating film 140, and the resist 242 is not only formed on the buried insulating film 102 but also formed so as to extend onto the P$^+$ diffusion region 130 and the N$^+$ diffusion region 132, so that it is formed larger.

Figure 11:
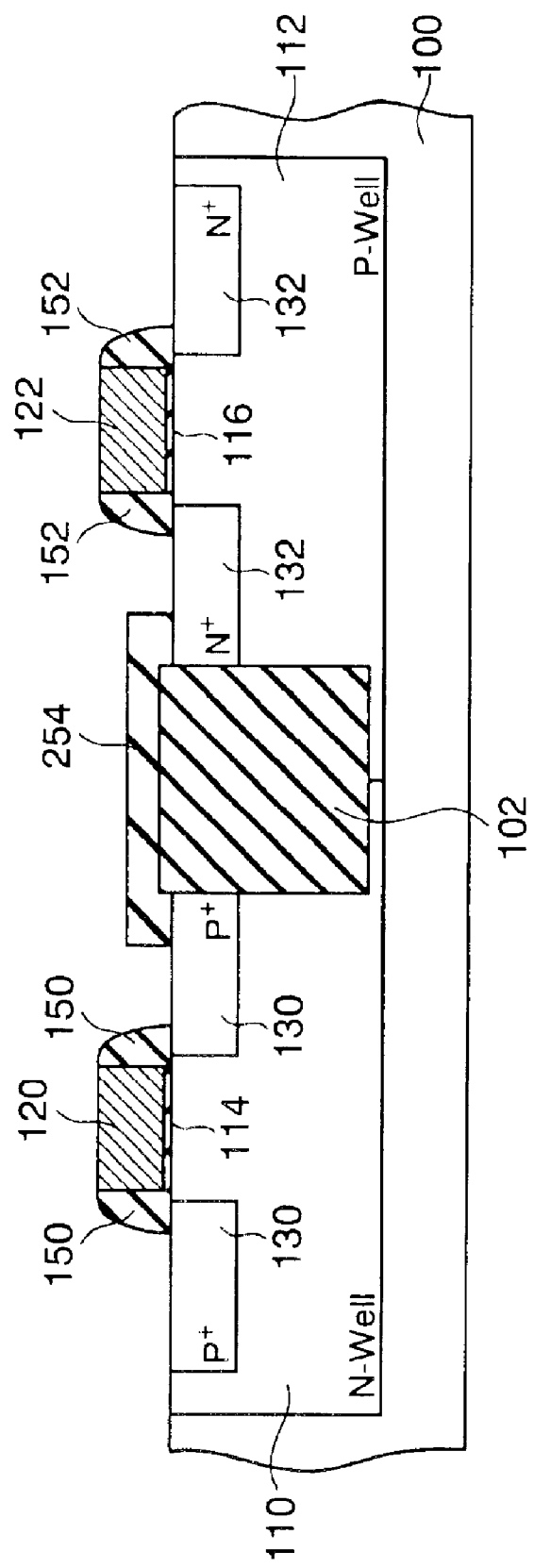
FIG. 11 is a sectional view explaining part of the manufacturing process of the semiconductor device according to the second embodiment.

Then, as shown in FIG. 11, by etching the insulating film 140 by RIE, the sidewalls 150 and 152 are formed on sidewall portions of the gate electrodes 120 and 122, and a protective film 254, which covers the buried insulating film 102 and a portion of each of the diffusion regions 130 and 132, is formed on the buried insulating film 102. Namely, by etching back the insulating film 140, the sidewalls 150 and 152 are formed in a self-alignment manner. Moreover, the protective film 254 is formed by leaving a portion of the insulating film 140, which is covered with the resist 242, by etching. This protective film 254 is formed so as to cover all the surface side of the buried insulating film 102 and a portion of each of the diffusion regions 130 and 132 and so as not to cover at least a region in which the undermentioned salicide metal layer is formed. Subsequently, a natural oxide film on the surface side of the semiconductor substrate 100 and particles are removed by cleaning with dilute HF. Also in this embodiment, since the buried insulating film 102 is covered with the protective film 254 at the time of this cleaning with dilute HF, the dissolution of SiO$_2$ can be prevented, which can prevent the generation of water mark.

Figure 12:
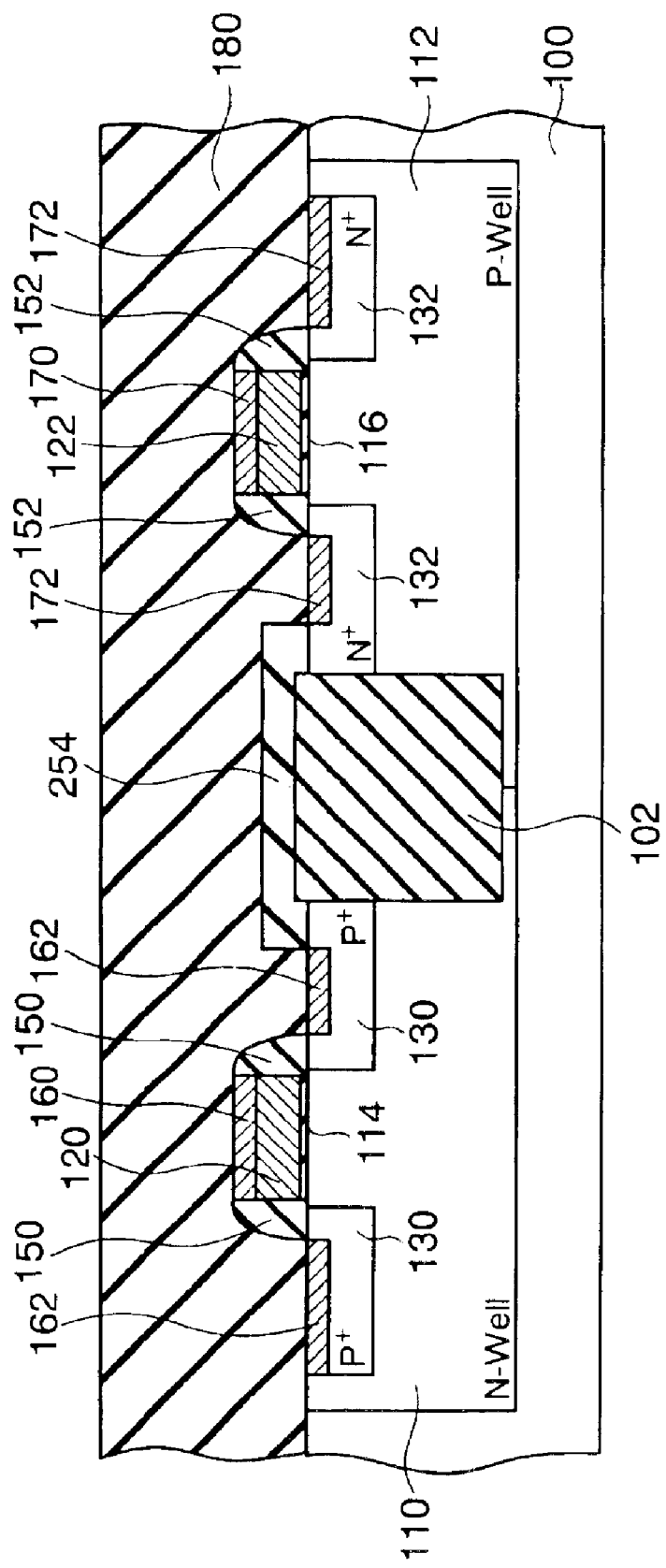
FIG. 12 is a sectional view explaining part of the manufacturing process of the semiconductor device according to the second embodiment.

The manufacturing process thereafter is the same as that in the aforementioned first embodiment. Namely, as shown in FIG. 12, the salicide metal layers 160, 162, 170, and 172 are formed on the surface sides of the polysilicon layers of the gate electrodes 120 and 122 and the surface sides of the diffusion regions 130 and 132 in a self-alignment manner. Subsequently, a silicon oxide film is formed on all the surface of the semiconductor substrate 100. Since the protective film 254 is formed on this occasion, a step between the gate electrodes 120 and 122 and the buried insulating film 102 is reduced, leading an improvement in the planarity of the silicon oxide film. Then, by planarizing the silicon oxide film by CMP (Chemical Mechanical Polishing), the interlayer dielectric 180 is formed.

As described above, also according to the semiconductor device according to this embodiment, by covering the buried insulating film 102 with the protective film 254, the precipitation of water mark from the buried insulating film 102 during cleaning treatment can be avoided, and hence the uniform salicide metal layers 160, 162, 170, and 172 can be formed. Consequently, the characteristics of the MISFETs can be maintained favorably.

Moreover, by covering the buried insulating film 102 with the protective film 254, the step between the buried insulating film 102 and the gate electrodes 120 and 122 is reduced, resulting in improved planarity when the interlayer dielectric is formed thereon.

Furthermore, a material for the protective film 254 is the same insulating film 140 used for the sidewalls 150 and 152, whereby the protective film 254 can be obtained without adding a new film forming process.

Figure 13:
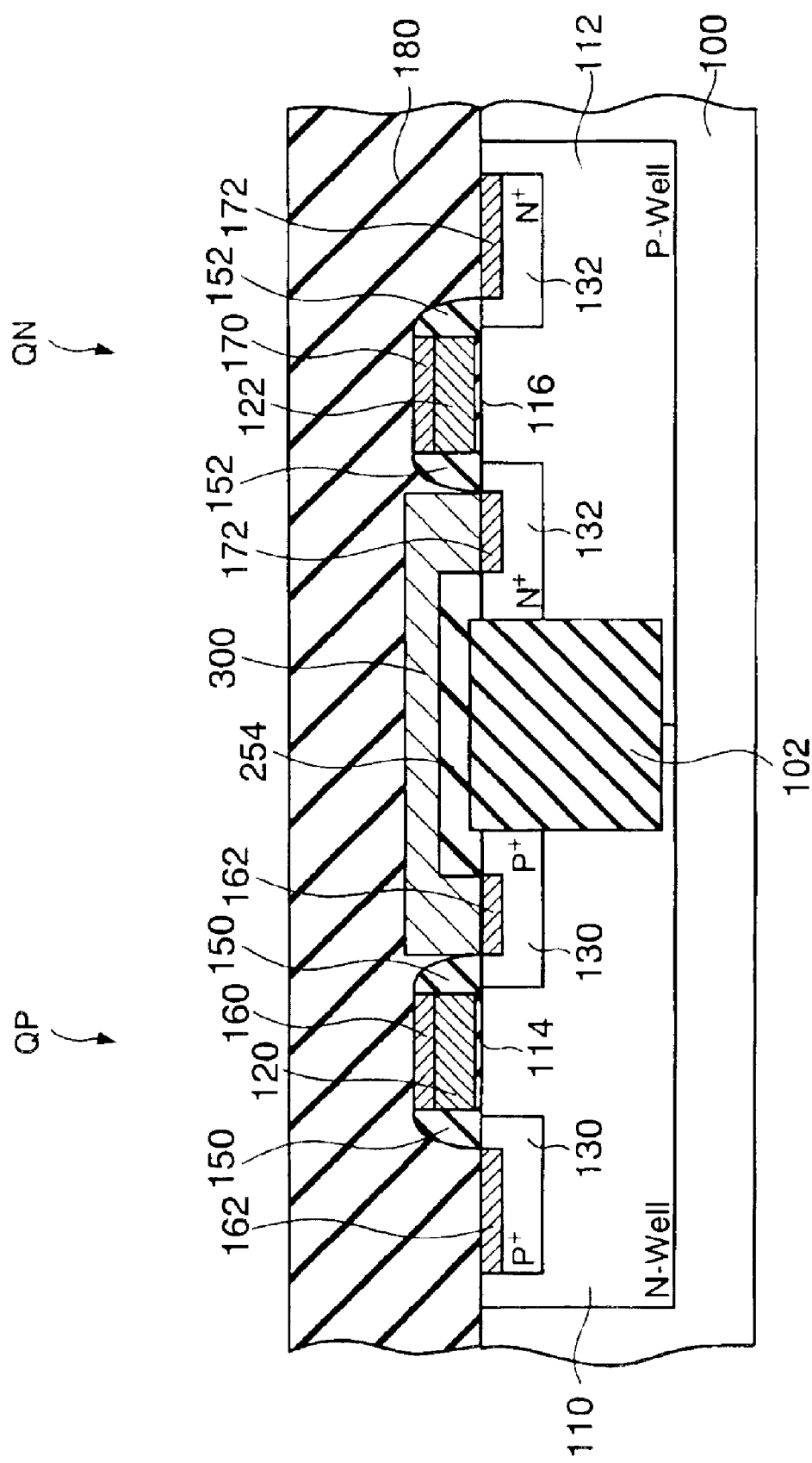
FIG. 13 is a sectional view for explaining an example of a case where a wiring layer is formed in the semiconductor device according to the second embodiment.

Additionally, the protective film 254 is formed in such a manner as to cover as far as a portion of each of the diffusion regions 130 and 132, whereby the diffusion regions 130 and 132 function as capacitors, and the parasitic capacitance of the MISFET can be increased. For example, it is assumed that a wiring layer 300 which electrically connects the diffusion region 130 and the diffusion region 132 is formed across the protective film 254 as shown in FIG. 13. In this case, the protective film 254 is sandwiched as a capacitor dielectric between the wiring layer 300 and the diffusion region 130, and the protective film 254 is also sandwiched as a capacitor dielectric between the wiring layer 300 and the diffusion region 132, so as to constitute capacitors. Therefore, the parasitic capacitances of two MISFETs can be increased, leading to an improvement in the drive capabilities of the MISFETs.

Figure 14:
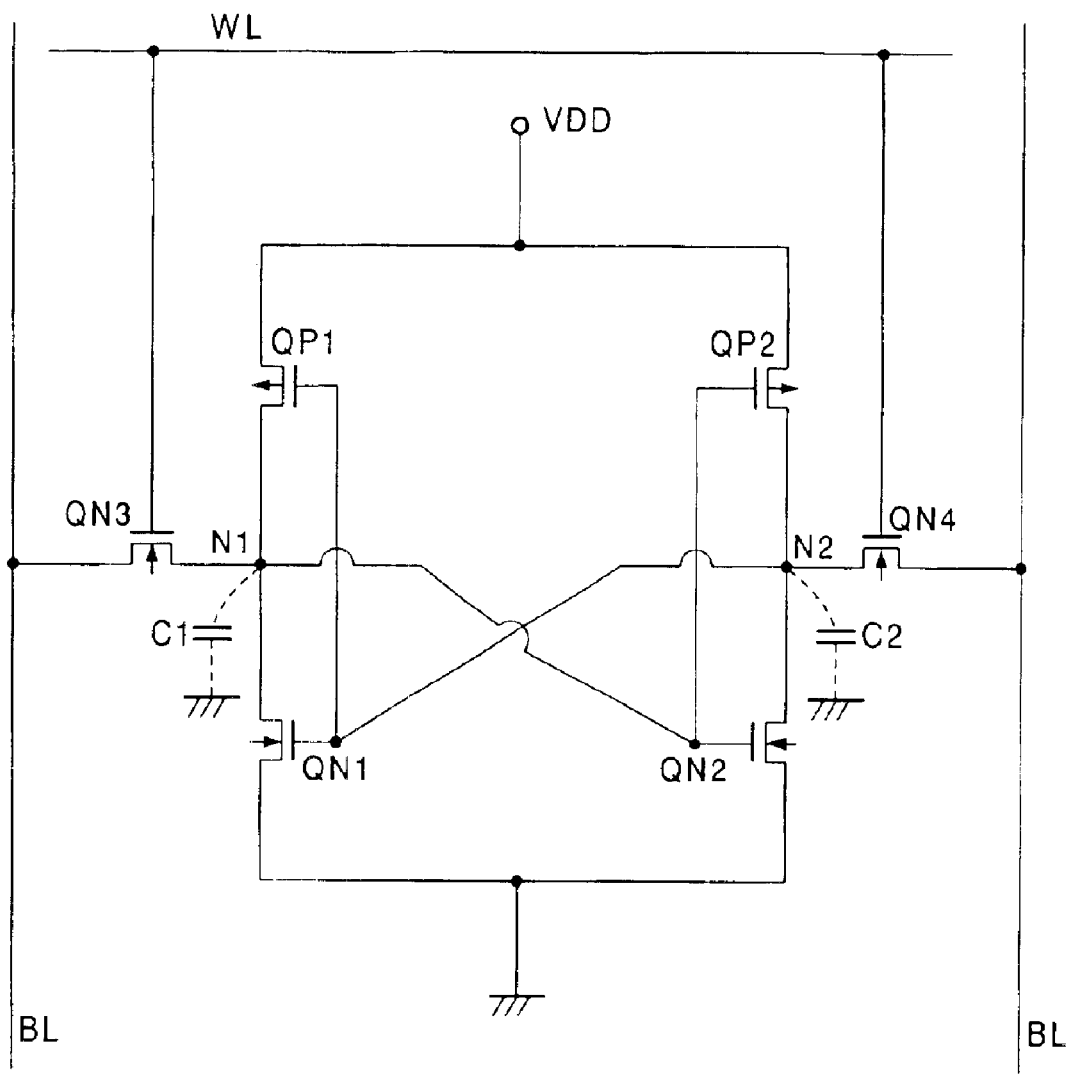
FIG. 14 is a circuit diagram for explaining an example of a case where an SRAM cell includes MISFETs shown in FIG. 13.

Hence, for example, by using the MISFETs according to this embodiment for an SRAM cell such as shown in FIG. 14, the data line drive capability of the SRAM cell can be improved. Namely, when a P-type MISFET in FIG. 13 is taken as QP and an N-type MISFET therein is taken as QN, in the SRAM cell in FIG. 14, one complementary MIS inverter is composed of a MISFET QP1 and a MISFET QN1, and the other complementary MIS inverter is composed of a MISFET QP2 and a MISFET QN2. A MISFET QN3 and a MISFET QN4 are selection transistors which are connected to bit lines BL as data read lines. Gates of these MISFET QN3 and MISFET QN4 are connected to a word line WL.

When the complementary MIS inverters structured as shown in FIG. 13 are used in such an SRAM cell, capacitors C1 and C2 are added to data output nodes N1 and N2 of the complementary MIS inverters, respectively. Hence, the drive capabilities of the data output nodes N1 and N2 for the bit lines BL can be raised.

It should be mentioned that the present invention is not limited to the aforementioned embodiments, and various changes may be made therein. For example, although in the aforementioned embodiments, in FIG. 7 and FIG. 11, a hydrogen fluoride (HF) solution is used as a solution used when the surface side of the semiconductor substrate 100 is cleaned, other hydrofluoric acid based solutions such as ammonium fluoride (NH$_4$F) may be used. In this case, a protective film resistant to the hydrofluoric acid based solution is required to be used as the protective films 154 and 254. However, hydrogen fluoride (HF) has a higher etching rate for oxide, and hence the hydrogen fluoride (HF) solution is the most suitable as a cleaning solution out of hydrofluoric acid based solutions.

Moreover, in FIG. 7 and FIG. 11, the solution used when the surface side of the semiconductor substrate 100 is cleaned is not limited to a hydrofluoric acid based solution, and any other cleaning solution having an equal cleaning effect can be used. In this embodiment, a protective film resistant to this used cleaning solution is required to be used as the protective films 154 and 254.

Furthermore, although the MISFETs are given as an example of semiconductor elements isolated by the buried insulating film 102 in the aforementioned embodiments, other semiconductor elements may be formed and isolated by the buried insulating film 102.

What is claimed is:

1. A manufacturing method of a semiconductor device including at least two MISFETs, one of which is a P-type MISFET and the other of which is an N-type MISFET, the method comprising:

forming a buried insulating film in a semiconductor substrate;

forming MISFETs isolated by the buried insulating film;

cleaning a surface side of the semiconductor substrate with a cleaning solution;

covering a surface side of the buried insulating film with a protective film before cleaning the surface side of the semiconductor substrate, wherein the protective film is resistant to the cleaning solution and the protective film is formed so as to cover a portion of a diffusion region of the P-type MISFET and a portion of a diffusion region of the N-type MISFET; and forming a wiring layer which is formed on the protective film and which electrically connects the diffusion region of the P-type MISFET and the diffusion region of the N-type MISFET.

2. The manufacturing method of the semiconductor device according to claim 1, wherein the cleaning solution is a hydrofluoric acid based solution.

3. The manufacturing method of the semiconductor device according to claim 2, wherein the hydrofluoric acid based solution is a hydrogen fluoride (HF) solution or an ammonium fluoride ($NH_4F$) solution.

4. The manufacturing method of the semiconductor device according to claim 2, wherein the protective film is a material which is resistant to the hydrofluoric acid based solution.

5. The manufacturing method of the semiconductor device according to claim 4, wherein the protective film is a silicon nitride film.

6. The manufacturing method of the semiconductor device according to claim 5, the manufacturing method further comprising forming a sidewall on a side portion of a gate electrode of the P-type MISFET and the N-type MISFET, and wherein the sidewall and the protective film are the same material.

7. The manufacturing method of the semiconductor device according to claim 6, further comprising forming a salicide metal layer on the gate electrode, a source diffusion region, and a drain diffusion region of the P-type MISFET and the N-type MISFET after the step of cleaning the surface side of the semiconductor substrate.

* * * * *